United States Patent
Tanaka et al.

(10) Patent No.: US 11,837,679 B2
(45) Date of Patent: Dec. 5, 2023

(54) DISPLAY DEVICE

(71) Applicants: TOHOKU UNIVERSITY, Sendai (JP); NICHIA CORPORATION, Anan (JP)

(72) Inventors: Tetsu Tanaka, Sendai (JP); Takafumi Fukushima, Sendai (JP); Hisashi Kino, Sendai (JP); Masatsugu Ichikawa, Tokushima (JP)

(73) Assignees: TOHOKU UNIVERSITY, Sendai (JP); NICHIA CORPORATION, Anan (JP)

( * ) Notice: Subject to any disclaimer, the term of this patent is extended or adjusted under 35 U.S.C. 154(b) by 0 days.

(21) Appl. No.: 17/512,673

(22) Filed: Oct. 28, 2021

(65) Prior Publication Data
US 2022/0140174 A1  May 5, 2022

(30) Foreign Application Priority Data

Oct. 30, 2020 (JP) ................. 2020-183010

(51) Int. Cl.
*H01L 31/153* (2006.01)
*H01L 31/02* (2006.01)
(Continued)

(52) U.S. Cl.
CPC ........ *H01L 31/153* (2013.01); *H01L 31/0203* (2013.01); *H01L 31/02005* (2013.01);
(Continued)

(58) Field of Classification Search
CPC ............. H01L 31/153; H01L 31/02005; H01L 31/02019; H01L 31/0203; H01L 31/02164; G09G 3/32; G09G 2360/141
See application file for complete search history.

(56) References Cited

U.S. PATENT DOCUMENTS

2009/0302329 A1   12/2009   Noma et al.
2011/0166462 A1   7/2011    Iijima et al.
(Continued)

FOREIGN PATENT DOCUMENTS

JP   02-203381    8/1990
JP   2000-306674  11/2000
(Continued)

OTHER PUBLICATIONS

S.-C. Huang, W.-H. Hsu, P. C. .-P. Chao and C. H. Tsai, "A New Active 3D Optical Proximity Sensor Array and its Readout Circuit," in IEEE Sensors Journal, vol. 14, No. 7, pp. 2185-2192, Jul. 2014, doi: 10.1109/JSEN.2014.2306846. (Year: 2014).*

*Primary Examiner* — Sitaramarao S Yechuri
(74) *Attorney, Agent, or Firm* — MORI & WARD, LLP

(57) ABSTRACT

A display device includes a substrate including a first surface, and a second surface positioned at a side opposite to the first surface; a first light-emitting element located at a lateral side of the substrate; a plurality of light-receiving elements located at a second surface side of the substrate; a plurality of second light-emitting elements located on the first surface of the substrate; and a first drive element controlling driving of the second light-emitting elements based on output of the light-receiving elements. A light-emitting surface of the first light-emitting element is oriented in a first direction. The first direction is parallel to a direction from the first surface toward the second surface. Light-emitting surfaces of the second light-emitting elements are oriented in a second direction. The second direction is from the second surface toward the first surface.

13 Claims, 11 Drawing Sheets

(51) Int. Cl.
*H01L 31/0216* (2014.01)
*H01L 31/0203* (2014.01)
*G09G 3/32* (2016.01)

(52) U.S. Cl.
CPC .. *H01L 31/02019* (2013.01); *H01L 31/02164* (2013.01); *G09G 3/32* (2013.01); *G09G 2310/0291* (2013.01); *G09G 2360/141* (2013.01)

(56) References Cited

U.S. PATENT DOCUMENTS

| | | | | |
|---|---|---|---|---|
| 2019/0155353 | A1* | 5/2019 | Matsuda | G06F 1/28 |
| 2020/0271824 | A1 | 8/2020 | Shimuta | |
| 2020/0397323 | A1* | 12/2020 | Ruponen | A61B 5/02438 |
| 2021/0140801 | A1* | 5/2021 | Matsuyama | H01L 31/173 |
| 2021/0399563 | A1* | 12/2021 | Moon | A61B 5/02055 |

FOREIGN PATENT DOCUMENTS

| | | |
|---|---|---|
| JP | 2006-278368 | 10/2006 |
| JP | 2007-266313 | 10/2007 |
| JP | 2009-163408 | 7/2009 |
| JP | 2009-295834 | 12/2009 |
| JP | 2011-139726 | 7/2011 |
| JP | 2018-157928 | 10/2018 |
| JP | 2020-134474 | 8/2020 |
| KR | 20210043892 A * | 4/2021 |

* cited by examiner

DISPLAY DEVICE

CROSS-REFERENCE TO RELATED APPLICATION

This application claims priority to Japanese Patent Application No. 2020-183010, filed on Oct. 30, 2020, the disclosure of which is hereby incorporated by reference in its entirety.

BACKGROUND

This document relates to a display device.

A semiconductor device that includes a light-receiving element and a light-emitting element has been proposed (e.g., Japanese Patent Publication No. H2-203381, Japanese Patent Publication No. 2020-134474, and Japanese Patent Publication No. 2011-139726).

SUMMARY

A display device is described herein that includes a light-receiving element and a light-emitting element.

According to one embodiment, a display device includes a substrate including a first surface, and a second surface positioned at a side opposite to the first surface; a first light-emitting element located at a lateral side of the substrate; a plurality of light-receiving elements located at the second surface side of the substrate; a plurality of second light-emitting elements located on the first surface of the substrate; and a first drive element controlling driving of the second light-emitting elements based on output of the light-receiving elements. A light-emitting surface of the first light-emitting element is oriented in a first direction. The first direction is parallel to a direction from the first surface toward the second surface. Light-emitting surfaces of the second light-emitting elements are oriented in a second direction. The second direction is from the second surface toward the first surface.

A display device is provided herein that includes a light-receiving element and a light-emitting element.

DETAILED DESCRIPTION

Figure 1:
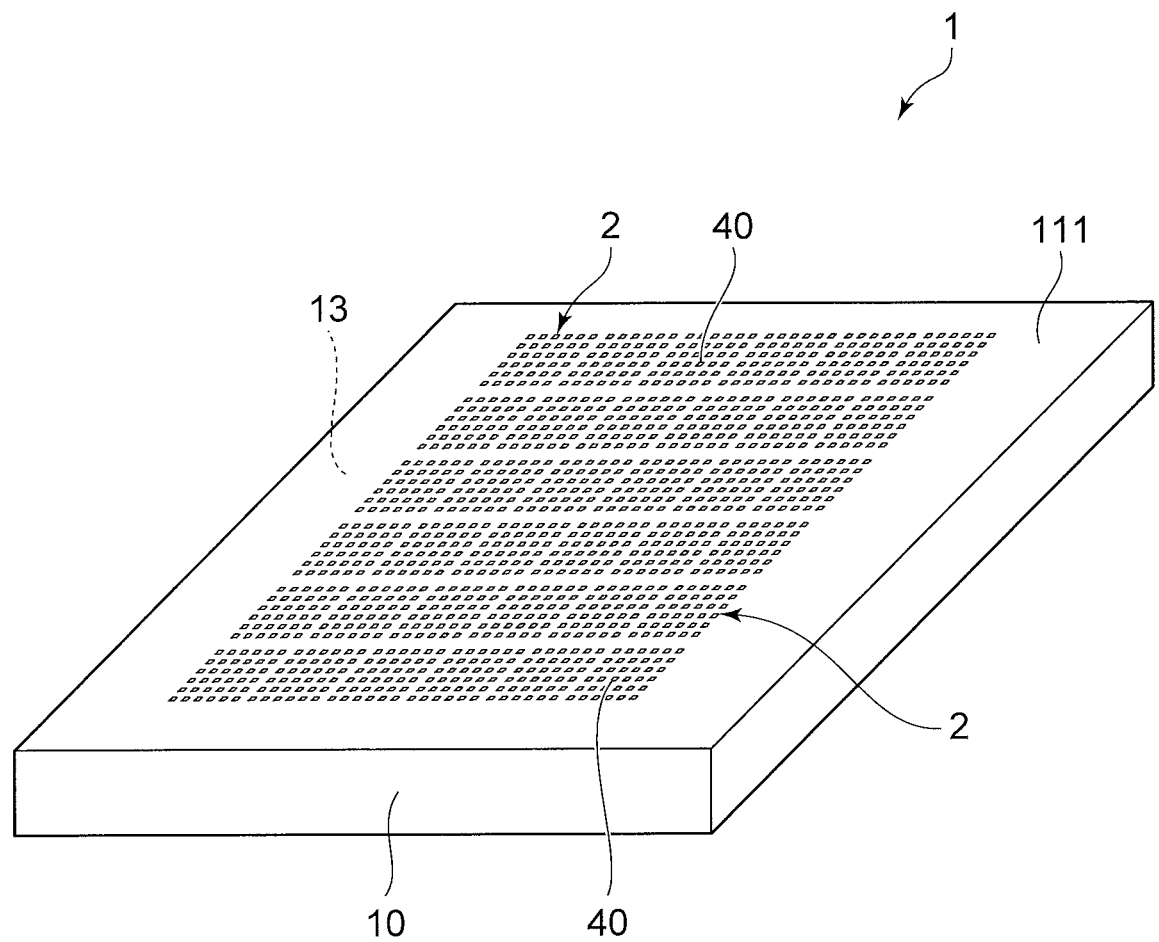
FIG. 1 is a schematic perspective view of a display device according to one embodiment.

Embodiments will now be described with reference to the drawings. The same or similar components or structures in the drawings are marked with the same reference numerals.

FIG. 1 is a schematic perspective view of a display device 1 according to one embodiment.

The display device 1 includes multiple display parts 2, and a holding member 10 that holds the multiple display parts 2. Compared to when one display part 2 is used, the display area can be widened by using the multiple display parts 2.

Figure 2:
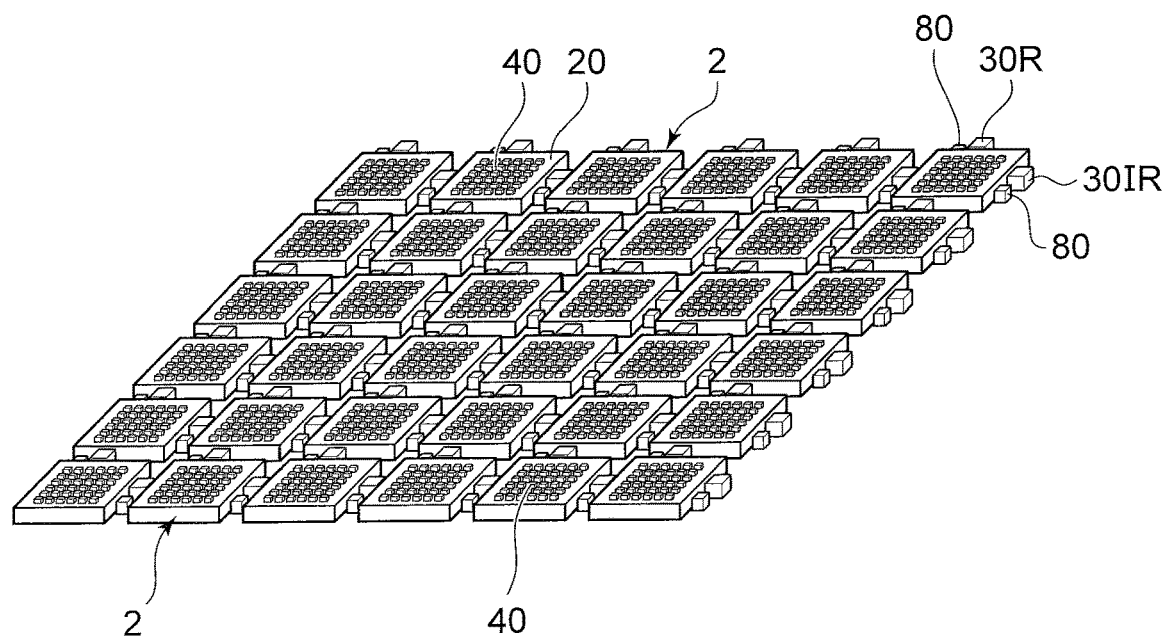
FIG. 2 is a schematic perspective view of multiple display parts without a holding member of FIG. 1.

FIG. 2 is a schematic perspective view of the multiple display parts 2 without the holding member 10 of FIG. 1. For example, the multiple display parts 2 are arranged in a matrix configuration.

Figure 3:
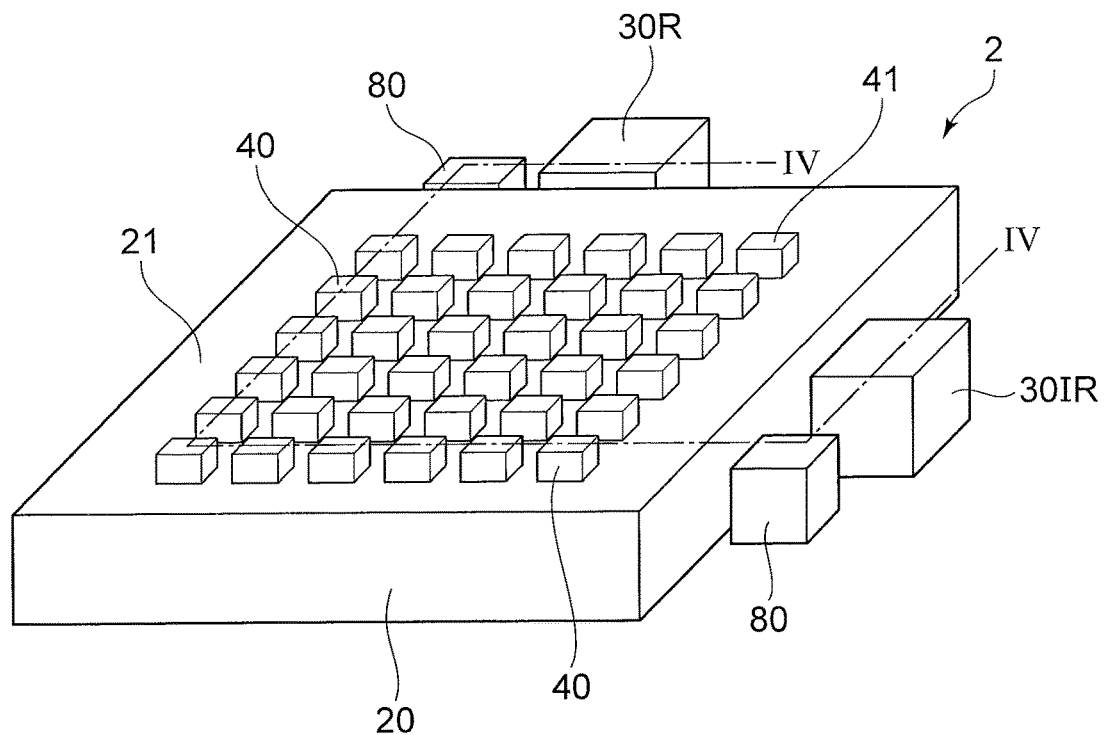
FIG. 3 is a schematic perspective view of one display part of FIG. 2.

FIG. 3 is a schematic perspective view of one display part 2.

Figure 4:
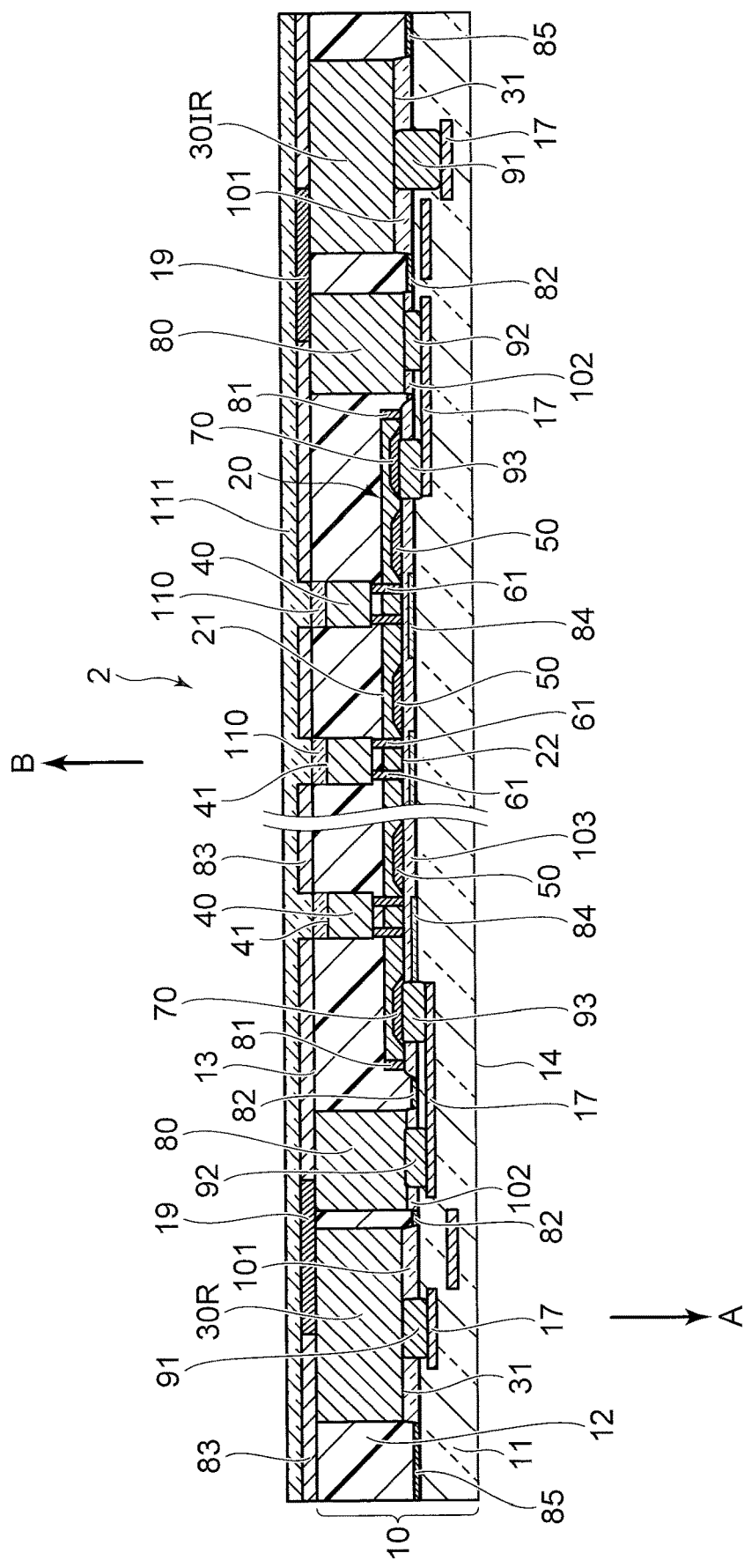
FIG. 4 is a schematic cross-sectional view along line IV-IV of FIG. 3.

FIG. 4 is a schematic cross-sectional view along line IV-IV of FIG. 3.

Some of the members are not illustrated in FIGS. 2 and 3 to simplify the description.

The display device 1 of one embodiment includes: a substrate 20 that includes a first surface 21, and a second surface 22 that is positioned at the side opposite to the first surface 21; first light-emitting elements 30R and 30IR located at lateral sides of the substrate 20; a plurality of light-receiving elements 50 located at the second surface 22 side of the substrate 20; a plurality of second light-emitting elements 40 located on the first surface 21 of the substrate 20; and a first drive element 60 that controls driving of the second light-emitting element 40 based on outputs of the light-receiving elements 50. Light-emitting surfaces 31 of the first light-emitting elements 30R and 30IR are oriented in a first direction A that is parallel to a direction from the first surface 21 toward the second surface 22. Light-emitting surfaces 41 of the second light-emitting elements 40 are oriented in a second direction B that is from the second surface 22 toward the first surface 21. Thereby, the second light-emitting elements 40 can perform a display that shows the configuration of the object irradiated with the light from the first light-emitting elements 30R and 30IR.

The display part 2 includes the substrate 20, the first light-emitting elements 30R and 30IR, the multiple light-receiving elements 50, and the multiple second light-emitting elements 40.

It is preferable for the holding member 10 to be a flexible material. Mounting is possible to objects having diverse configurations because the display parts 2 are held by the holding member 10 that is located between the display parts 2 and is formed of a flexible material. In FIG. 4, the holding member 10 is a resin member. The resin member can be used as a flexible holding material. The resin member includes at least a first resin member 11, and a second resin member 12 that is located on the first resin member 11. The first resin member 11 is transmissive to the light emitted by the first light-emitting elements 30R and 30IR and the light received by the light-receiving element 50. The first resin member 11 can include, for example, a material having a transmittance of not less than 50% and not more than 100%. Preferably, the first resin member 11 can include a material having a transmittance of not less than 80% and not more than 100%. The second resin member 12 is reflective to the light emitted by the first light-emitting elements 30R and 30IR and the second light-emitting element 40. The second resin member 12 can include, for example, a material having a reflectance of not less than 50% and not more than 100% when a photometric sphere is used. Preferably, the second resin member 12 can include a material having a reflectance of not less than 80% and not more than 100% when a photometric sphere is used. The second resin member 12 includes, for example, particles of titanium oxide, etc. The holding member 10 can include a transmissive hydrogel.

The substrate 20 includes the first surface 21, and the second surface 22 that is positioned at the side opposite to the first surface 21. The substrate 20 is disposed so that the second surface 22 contacts the upper surface of the first resin member 11. The substrate 20 is, for example, a silicon substrate. Using silicon substrate can facilitate providing the light-receiving element 50 in the second surface 22 side of a silicon substrate. A silicon substrate also is preferable because the light-receiving element 50 and the first drive element 60 that is described below can be made in the silicon substrate. If the substrate 20 is a silicon substrate, a second drive element 70 also can be made in the silicon substrate.

The first light-emitting elements 30R and 30IR are located on the first resin member 11 at the lateral sides of the substrate 20. The light-emitting surfaces 31 of the first light-emitting elements 30R and 30IR are oriented in the first direction A that is parallel to a direction from the first surface 21 toward the second surface 22 of the substrate 20. The first light-emitting elements 30R and 30IR are, for example, light-emitting diodes (LEDs) or laser diodes (LDs). In the case of a laser diode, it is preferable for a surface-emitting laser such as a vertical-cavity surface-emitting laser (VCSEL) to be used. Compared to an edge-emitting laser, a surface-emitting laser is easier to use as the first light-emitting elements 30R and 30IR because the electrodes can be provided at the same surface side as the light-emitting surface.

The wavelength of the light emitted by the first light-emitting elements 30R and 30IR can be received by the light-receiving element 50. The light-receiving element 50 receives light that corresponds to the light emitted by the first light-emitting elements 30R and 30IR, and a display by the second light-emitting element 40 is possible. For example, light of a wavelength that can be received by the light-receiving element 50 can be generated by performing wavelength conversion of the light emitted by the first light-emitting elements 30R and 30IR by an interaction with a wavelength conversion member or an irradiation object. Multiple first light-emitting elements 30R and 30IR that have mutually-different light emission peak wavelengths are provided in one display part 2. The objects that are capable of being visualized can be increased thereby. Light of appropriate light emission peak wavelengths can be used according to the wavelength dependence of the absorptance and/or reflectance of the irradiation object of the light emitted by the first light-emitting elements 30R and 30IR. For example, the light emission peak wavelengths of the first light-emitting elements 30R and 30IR can be separated by a spacing of not less than 10 nm and not more than 400 nm. The light emission peak wavelengths of the first light-emitting elements 30R and 30IR can be separated by a spacing of not less than 20 nm and not more than 100 nm. Thereby, the first light-emitting elements 30R and 30IR that have peak wavelengths before and after the rise of the light absorption edge of the irradiation object can be used as the reference light; therefore, a display is possible by selecting appropriate wavelengths. The peak wavelength difference between the first light-emitting elements 30R and 30IR can be modified as appropriate according to the absorption edge of the irradiation object and can be, for example, not less than 1 nm. By setting the spacing of the light emission peak wavelengths of the light emitted by the first light-emitting elements 30R and 30IR to be not less than 10 nm and not more than 400 nm, it is easier to distinguish (i) the reflected light that is emitted by the first light-emitting element 30R and reflected by the irradiation object and (ii) the reflected light that is emitted by the first light-emitting element 30IR and reflected by the irradiation object, when both are received by the light-receiving element 50. For example, ultraviolet light, blue light, green light, yellow light, red light, and near-infrared light can be used as the light that is emitted by the first light-emitting elements 30R and 30IR. Light of such wavelengths can be selected appropriately from wavelengths that can be received by the light-receiving element 50. The widths at half maximum of the first light-emitting elements 30R and 30IR are, for example, not more than 30 nm. For example, the first light-emitting element 30R emits red light, and the first light-emitting element 30IR emits infrared light.

In the specification, ultraviolet light means that the light emission peak wavelength is within the range of not less than 365 nm but less than 410 nm. Blue light means that the light emission peak wavelength is within the range of not less than 410 nm but less than 500 nm. Green light means that the light emission peak wavelength is within the range of not less than 500 nm but less than 570 nm. Yellow light means that the light emission peak wavelength is within the range of not less than 570 nm but less than 600 nm. Red light means that the light emission peak wavelength is within the range of not less than 600 nm but less than 750 nm. Near-infrared light means that the light emission peak wavelength is within the range of not less than 750 nm and not more than 1300 nm. It is preferable to use ultraviolet light when there is unique absorption in the ultraviolet region. For example, titanium oxide is an example of a material having unique absorption in the ultraviolet region. For example, it is preferable to use red light and near-infrared light for living body observation. Red light and near-infrared light are said to be in wavelength regions that easily pass through living bodies. For example, the state of blood can be observed utilizing red light and near-infrared light by using this feature.

The multiple light-receiving elements 50 are located at the second surface 22 side of the substrate 20. The light-receiving element 50 is, for example, a photodiode. It is preferable for the major material of the photodiode to be an inorganic semiconductor material; for example, silicon (Si), germanium (Ge), and indium gallium arsenide (InGaAs). When the substrate 20 is a silicon substrate, it is particularly preferable to use Si as the major material of the photodiode. Thereby, the photodiode can be provided inside the substrate 20 at the second surface 22 side by doping the second surface 22 side with an impurity. The first drive element 60 that is described below and the light-receiving element 50 can be integrally provided in the substrate 20 by setting the major material of the substrate 20, the major material of the first drive element 60, and the major material of the light-receiving element 50 to be the same. Thereby, the light-receiving element 50 can be provided inside the substrate 20, and the display device 1 can be thinner than when the light-receiving element 50 is provided outside the substrate 20.

The multiple second light-emitting elements 40 are located on the first surface 21 of the substrate 20. The light-emitting surface 41 of the second light-emitting element 40 is oriented in the second direction B that is from the second surface 22 toward the first surface 21 of the substrate 20. The second light-emitting element 40 is, for example, an LED. It is preferable for the major material of the LED to be an inorganic semiconductor material. By using an inorganic semiconductor as the major material of the LED, the luminance can be greater than when an organic semiconductor is used. The major material of the LED is, for example, a gallium nitride semiconductor or a gallium arsenide semiconductor. For example, the light emission peak wavelength of the second light-emitting element 40 can be shorter than the light emission peak wavelengths of the first light-emitting elements 30R and 30IR.

Figure 5:
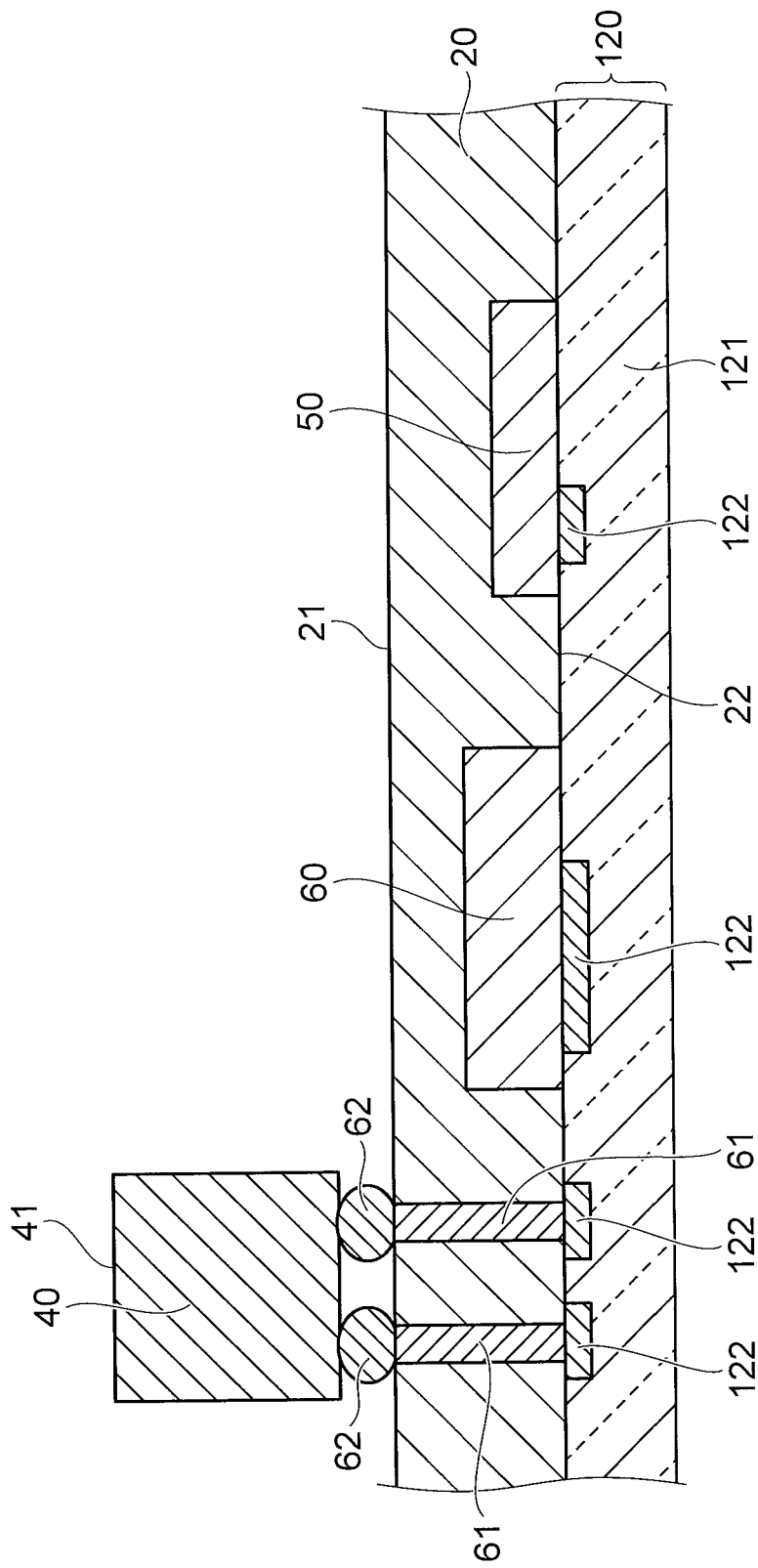
FIG. 5 is a more detailed schematic cross-sectional view of a portion where a light-receiving element and a second light-emitting element are located.

FIG. 5 is a more detailed schematic cross-sectional view of the portion where the light-receiving element 50 and the second light-emitting element 40 are located.

The first drive element 60 is located at the second surface 22 side of the substrate 20. The first drive element 60 controls the driving of the second light-emitting element 40 based on the output of the light-receiving element 50. For example, when the light-receiving element 50 is a photodiode, the driving of the second light-emitting element 40 is controlled according to the current generated by the photoelectric conversion of the photodiode. Multiple first drive elements 60 are provided to correspond to the number of the multiple light-receiving elements 50 and the number of the multiple second light-emitting elements 40. For example, the number of the first drive elements 60 is equal to the number of the light-receiving elements 50. For example, the first drive element 60 is connected with one of the multiple second light-emitting elements 40, or is connected with two or three of the second light-emitting elements 40. The first drive element 60 is formed as a semiconductor integrated circuit that includes transistors formed in the second surface 22 side of the substrate 20.

A wiring part 120 is located at the second surface 22 of the substrate 20. The wiring part 120 includes an insulating layer 121, and a multilevel interconnect layer that is located in the insulating layer 121. The material of the multilevel interconnect layer is, for example, copper (Cu), aluminum (Al), or silver (Ag). FIG. 5 shows only a first wiring layer 122 that is one layer of the multilevel interconnect layer most proximate to the substrate 20 side. Also, vias that connect within the multilevel interconnect layer are formed in the insulating layer 121. The insulating layer 121 is transmissive to the light received by the light-receiving element 50.

The light-receiving element 50 and the first drive element 60 are electrically connected with the first wiring layer 122. The second light-emitting element 40 is located on the first surface 21 of the substrate 20 with a conductive bonding material, e.g., a bump 62 interposed. A first conductive member 61 that extends between the first surface 21 and the second surface 22 is formed in the substrate 20. Compared to when an electrode that does not extend through the first and second surfaces 21 and 22 is used, the electrical power loss can be reduced because the connection distance between the second light-emitting element 40 and the first wiring layer 122 that is described below can be short. When the substrate 20 is a silicon substrate, the first conductive member 61 is a so-called through-silicon electrode and is called a TSV (through-silicon via). The material of the first conductive member 61 is, for example, copper (Cu), tungsten (W), or gold (Au).

The first conductive member 61 connects the bump 62 that is located at the first surface 21 side and the first wiring layer 122 that is located at the second surface 22 side. The second light-emitting element 40 includes positive-side and negative-side electrodes at the side opposite to the light-emitting surface 41, and the electrodes are connected to the first conductive members 61. The second light-emitting element 40 is electrically connected with the first wiring layer 122 via the bump 62 and the first conductive member 61. The light-receiving element 50, the first drive element 60, and the second light-emitting element 40 are electrically connected to each other via the multilevel interconnect layer that includes the first wiring layer 122.

Figure 6:
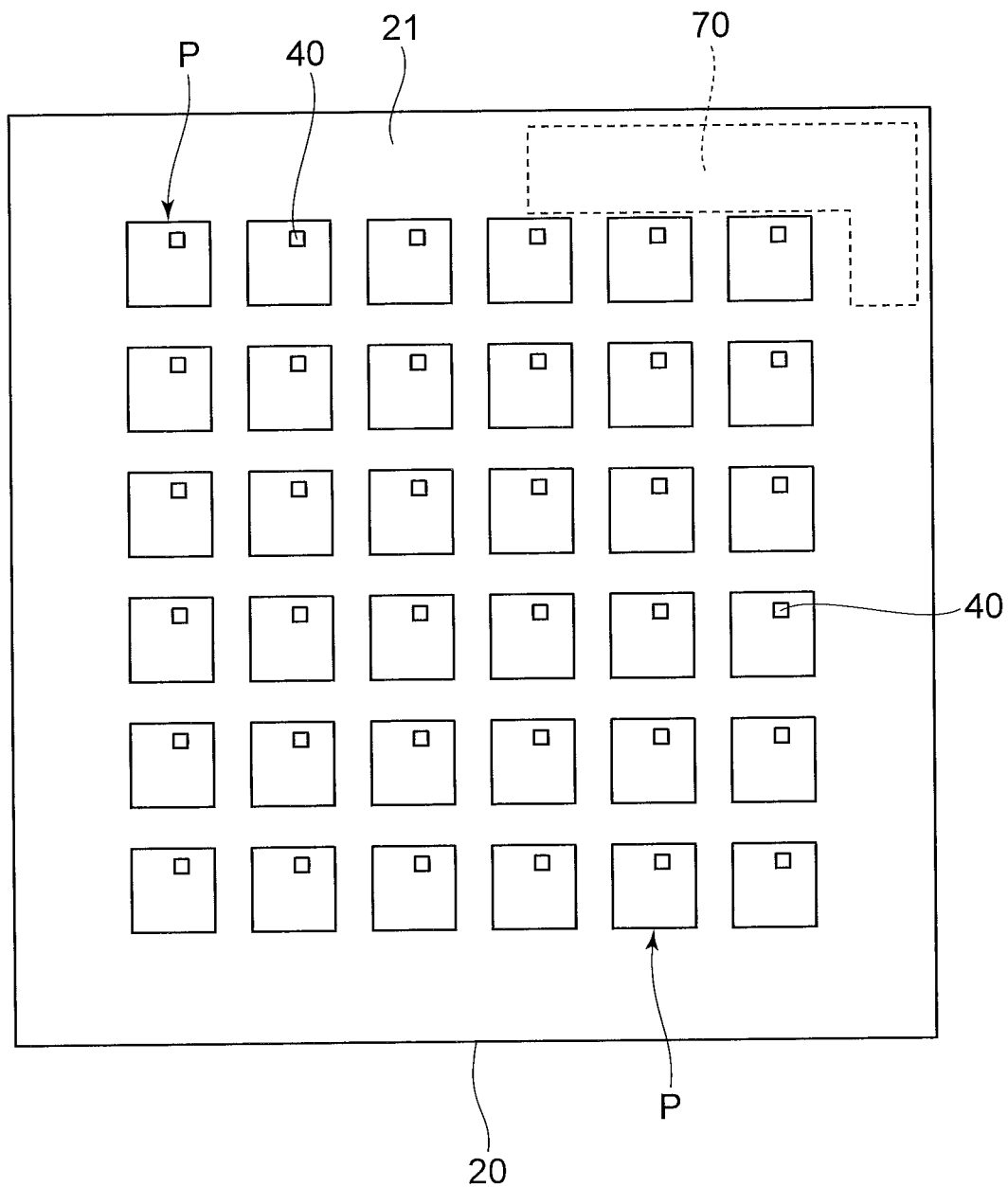
FIG. 6 is a schematic plan view of a first surface side of a substrate in the display device according to one embodiment.

FIG. 6 is a schematic plan view of the first surface 21 side of the substrate 20.

Figure 7:
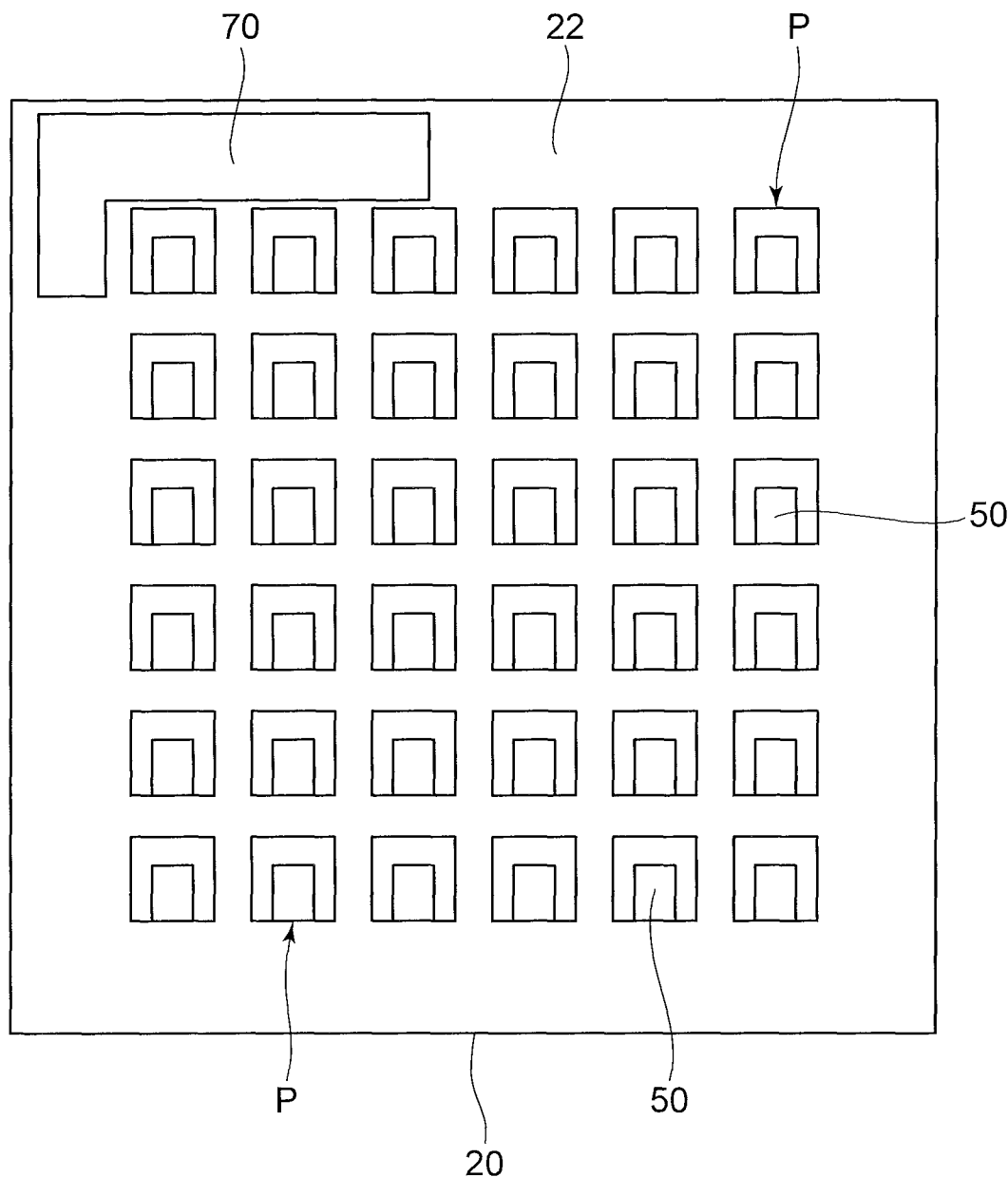
FIG. 7 is a schematic plan view of a second surface side of the substrate in the display device according to one embodiment.

FIG. 7 is a schematic plan view of the second surface 22 side of the substrate 20.

Figure 8:
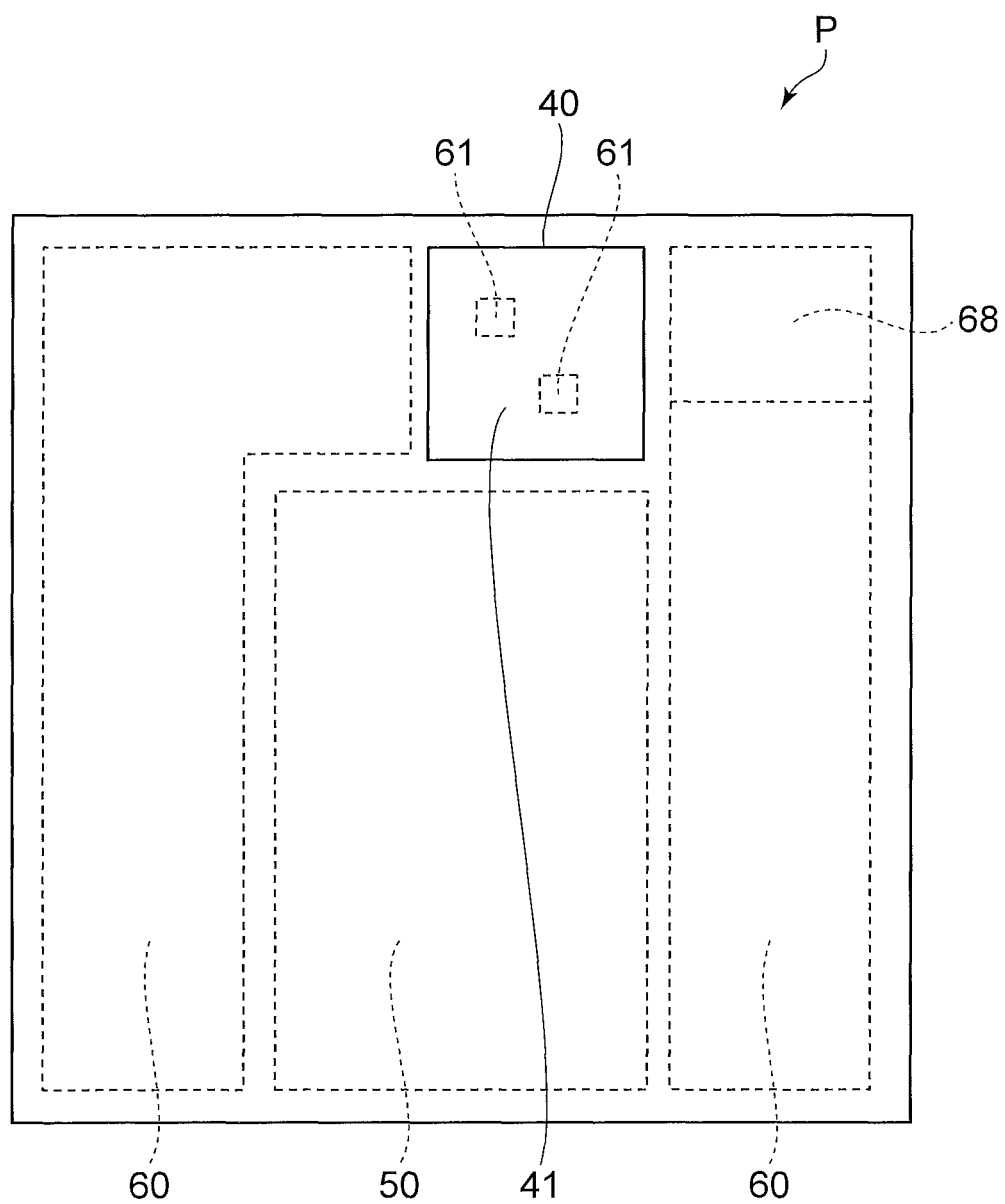
FIG. 8 is a schematic plan view of one pixel part of the embodiment shown in FIG. 6.

FIG. 8 is a schematic plan view of one pixel part P shown in FIG. 6.

Figure 9:
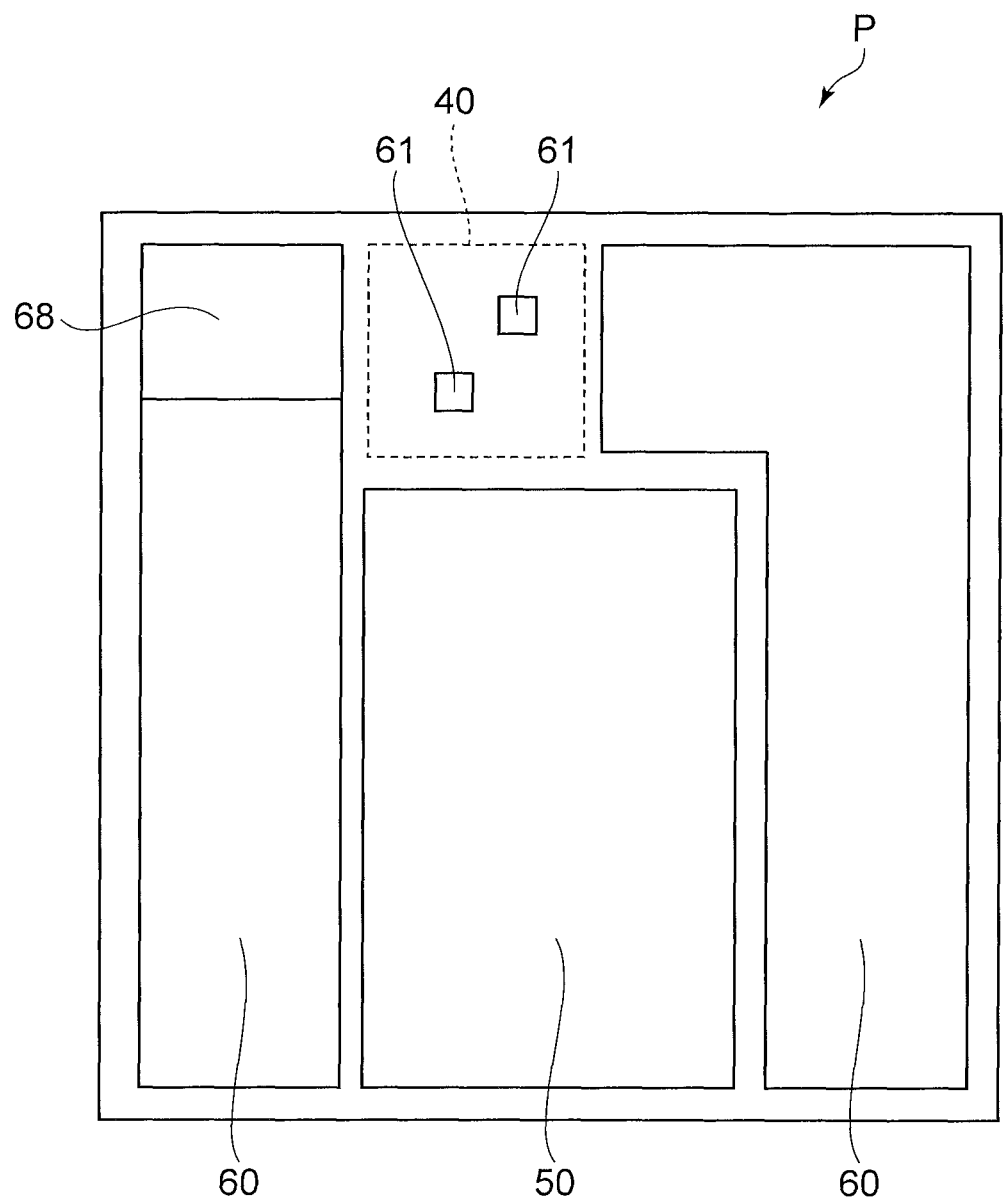
FIG. 9 is a schematic plan view of one pixel part of the embodiment shown in FIG. 7.

FIG. 9 is a schematic plan view of one pixel part P shown in FIG. 7.

FIGS. 6 to 9 will now be referred to. One of the multiple light-receiving elements 50 is electrically connected with at least one of the second light-emitting elements 40 via one of the multiple first drive elements 60. One of the first drive elements 60 and the light-receiving element 50 that is the most proximate to the one of the first drive elements 60 among the multiple light-receiving elements 50 are connected. Also, one of the first drive elements 60 and the second light-emitting element 40 that is the most proximate to the one of the first drive elements 60 among the multiple second light-emitting elements 40 are connected. Thereby, compared to when the light-receiving element 50 and the second light-emitting element 40 that are the most approximate to the first drive elements 60 are not connected, the wiring length between the light-receiving element 50, the first drive element 60, and the second light-emitting element 40 that are to be connected can be shortened, therefore, the electrical power loss when driving the second light-emitting element 40 can be reduced.

The display part 2 further includes the second drive element 70 and a second conductive member 80. The second drive element 70 is formed as a semiconductor integrated circuit that includes transistors. The second drive element 70 can be formed at the second surface 22 side of the substrate 20. The second drive element 70 controls the driving of the first light-emitting elements 30R and 30IR. The second conductive member 80 is located at the lateral side of the substrate 20, is held by the holding member 10, and electrically connects the first light-emitting elements 30R and 30IR and the second drive element 70. Thereby, the driving of the first light-emitting elements 30R and 30IR can be controlled using the second drive element 70 that is formed at the second surface 22 side of the substrate 20. It is unnecessary to provide the second drive element 70 outside the display device 1, and the display device 1 can be downsized.

A second wiring layer 17 is located in the first resin member 11. The second wiring layer 17 is, for example, a multilevel interconnect layer. The substrate 20 is disposed on the first resin member 11 so that the second surface 22 faces the upper surface of the first resin member 11, and the second drive element 70 that is located at the second surface 22 side of the substrate 20 is electrically connected with the second wiring layer 17 via a conductive connection member 93. The light-receiving surface of the light-receiving element 50 faces the upper surface of the first resin member 11.

A third resin member 103 is located between the second surface 22 of the substrate 20 and the upper surface of the first resin member 11. The third resin member 103 covers the lateral surface of the connection member 93. The third resin member 103 is also located between the light-receiving surface of the light-receiving element 50 and the upper surface of the first resin member 11. The third resin member 103 is transmissive to the light received by the light-receiving element 50. The third resin member 103 can include, for example, a silicone resin and/or an epoxy resin.

The second conductive member 80 is electrically connected with the second wiring layer 17 via a conductive connection member 92. A fourth resin member 102 is located between the second conductive member 80 and the upper surface of the first resin member 11. The fourth resin member 102 covers the lateral surface of the connection member 92. The fourth resin member 102 can include, for example, a silicone resin and/or an epoxy resin. The second conductive member 80 is, for example, a metal chip (or block) formed of copper (Cu). Or, the second conductive member 80 can have a configuration in which an electrode extends vertically through an insulator or a semiconductor. Or, the second conductive member 80 can be a metal or a conductive paste provided in a through-hole formed in the second resin member 12.

The first light-emitting elements 30R and 30IR are electrically connected with the second wiring layer 17 via a connection member 91. A resin 101 is located between the upper surface of the first resin member 11 and the first light-emitting elements 30R and 30IR. The resin 101 covers the lateral surface of the connection member 91.

The holding member 10 holds the substrate 20, the first light-emitting elements 30R and 30IR, and the second light-emitting element 40 and includes a third surface 13 and a fourth surface 14 that is positioned at the side opposite to the third surface 13. The third surface 13 faces the first surface 21 of the substrate 20, and the fourth surface 14 faces the second surface 22 of the substrate 20. The substrate 20, the first light-emitting elements 30R and 30IR, and the second light-emitting element 40 can be integrated thereby. This can facilitate mounting.

A third wiring layer 19 that electrically connects the first light-emitting elements 30R and 30IR and the second conductive member 80 is located on the third surface 13. For example, the first light-emitting elements 30R and 30IR include electrodes respectively at the light-emitting surface 31 side and the side opposite to the light-emitting surface 31 side. The electrodes at the upper sides of the first light-emitting elements 30R and 30IR are electrically connected with the second drive element 70 via the third wiring layer 19, the second conductive member 80, the connection member 92, the second wiring layer 17, and the connection member 93. The electrodes at the lower sides of the first light-emitting elements 30R and 30IR are electrically connected with the second drive element 70 via the connection member 91, the second wiring layer 17, and the connection member 93.

The holding member 10 holds the configurations described above. The second resin member 12 covers the lateral surfaces of the first light-emitting elements 30R and 30IR, the lateral surface of the second conductive member 80, the lateral surface of the second light-emitting element 40, the lateral surface of the substrate 20, and the first surface 21 of the substrate 20. The second resin member 12 is, for example, a white resin. Specifically, the second resin member 12 is a silicone resin that includes $TiO_2$ particles. The contrast of the display device can be increased because the luminance is increased by the light that is emitted by the second light-emitting element 40 being reflected by the second resin member 12.

The light that is emitted by the first light-emitting elements 30R and 30IR exits outside the display device 1 from the fourth surface 14 of the holding member 10 as reference light. As described below, for example, the reference light is reflected by a visualization object such as a blood vessel of a human, etc., and the reflected light passes through the first resin member 11 from the fourth surface 14 side and is incident on the light-receiving element 50.

The light-emitting surfaces 31 of the first light-emitting elements 30R and 30IR do not protrude beyond the second surface 22 of the substrate 20 toward the fourth surface 14 side of the holding member 10. Thereby, the light that is emitted from the first light-emitting elements 30R and 30IR is prevented from being directly incident on the light-receiving element 50, and the erroneous detection of unnecessary light by the light-receiving element 50 can be reduced.

The display part 2 further includes a first light-shielding film 81, a second light-shielding film 82, a third light-shielding film 83, a fourth light-shielding film 84, and a fifth light-shielding film 85. The colors of these light-shielding films are, for example, darkish or blackish. For example, the first light-shielding film 81, the second light-shielding film 82, the third light-shielding film 83, the fourth light-shielding film 84, and the fifth light-shielding film 85 are formed of a black matrix material such as chromium oxide, etc. Or, the light-shielding films 81 to 85 are formed of a silicone resin, an epoxy resin, or the like that includes carbon or a pigment. It is preferable for the pigment to be darkish or blackish. It is preferable for the fourth light-shielding film 84 and the fifth light-shielding film 85 to be silicone resins or epoxy resins that include a pigment. These materials are not conductive and can prevent shorts of the display device.

The first light-shielding film 81 is located at the lateral surface of the substrate 20. The first light-shielding film 81 suppresses the light that is emitted from the first light-emitting elements 30R and 30IR from being incident on the light-receiving element 50 via the lateral surface of the substrate 20, and can suppress the erroneous detection of unnecessary light by the light-receiving element 50.

The second light-shielding film 82, the fourth light-shielding film 84, and the fifth light-shielding film 85 are located at the upper surface of the first resin member 11 other than the path of the light. When viewed in plan, the second light-shielding film 82 is located between the light-receiving element 50 and the first light-emitting elements 30R and 30IR. Stray light can be reduced thereby. The fourth light-shielding film 84 is located between the second surface 22 of the substrate 20 and the upper surface of the first resin member 11. The incident angle of the light that is incident on the light-receiving element 50 can be limited thereby. The stray light that is incident on the light-receiving element 50 can be reduced thereby. When viewed in plan, the fifth light-shielding film 85 is located at the upper surface of the first resin member 11 between the end surface (the lateral surface) of the holding member 10 and the first light-emitting elements 30R and 30IR. Stray light can be reduced thereby.

The light-receiving surface of the light-receiving element 50 does not overlap the fourth light-shielding film 84 when viewed in plan. The incident angle of the light through the fourth surface 14 side of the holding member 10 to the light-receiving element 50 can be limited by the fourth light-shielding film 84. An image that more accurately shows the configuration and/or position of the visualization object (the irradiation object of the light) can be acquired thereby. Also, the fourth light-shielding film 84 reduces the light reflected from the irradiation object of the light to be absorbed by the first drive element 60. This can suppress misoperation of the first drive element 60.

The third light-shielding film 83 is located at the third surface 13 of the holding member 10. The light-emitting surface 41 of the second light-emitting element 40 is not covered with the third light-shielding film 83. The third light-shielding film 83 can improve the contrast of the image obtained by the light emission of the multiple second light-emitting elements 40. Also, the third light-shielding film 83 can cover portion(s) of the upper surfaces of the first light-emitting elements 30R and 30IR other than portion(s) where the third wiring layer 19 are located. This can suppress leakage of the light emitted by the first light-emitting elements 30R and 30IR toward the display side, and the contrast of the image obtained by the light emission of the multiple second light-emitting elements 40 can be improved. Also, the penetration of natural light (outside light) into the display device can be suppressed. Stray light can be suppressed thereby.

An optical member 110 can be provided on the light-emitting surface 41 of the second light-emitting element 40. The optical member 110 is, for example, glass or a wavelength conversion member. The wavelength conversion member can include a phosphor. The phosphor can include, for example, YAG. The wavelength conversion member can include semiconductor nanoparticles capable of wavelength conversion. It is preferable to provide a wavelength conversion member when the optical member 110 is provided. Thereby, wavelength conversion of the light from the second light-emitting element 40 can be performed according to the purpose.

A protective layer 111 that is transmissive to the light emitted by the second light-emitting element 40 is located on the third surface 13 of the holding member 10. The protective layer 111 covers the third light-shielding film 83 and the optical member 110. Or, the protective layer 111 can directly cover the light-emitting surface 41 of the second light-emitting element 40 without providing the optical member 110.

Multiple pixel parts P are arranged in a matrix configuration in the substrate 20. Each pixel part P includes the second light-emitting element 40 at the first surface 21 side, the light-receiving element 50 and the first drive element 60 that controls the driving of the second light-emitting element 40 based on the output of the light-receiving element 50, at the second surface 22 side. In other words, the multiple light-receiving elements 50 are arranged in a matrix configuration at the second surface 22 side of the substrate 20. Also, the same number of multiple second light-emitting elements 40 as the multiple light-receiving elements 50 is arranged in a matrix configuration on the first surface 21 of the substrate 20.

As shown in FIG. 7, the second drive element 70 that drives the first light-emitting elements 30R and 30IR is located in a region of the second surface 22 of the substrate 20 outside the region in which the multiple pixel parts P are located.

As shown in FIG. 9, each pixel part P further includes the first drive element 60 that is located at the second surface 22 side of the substrate 20.

Figure 10:
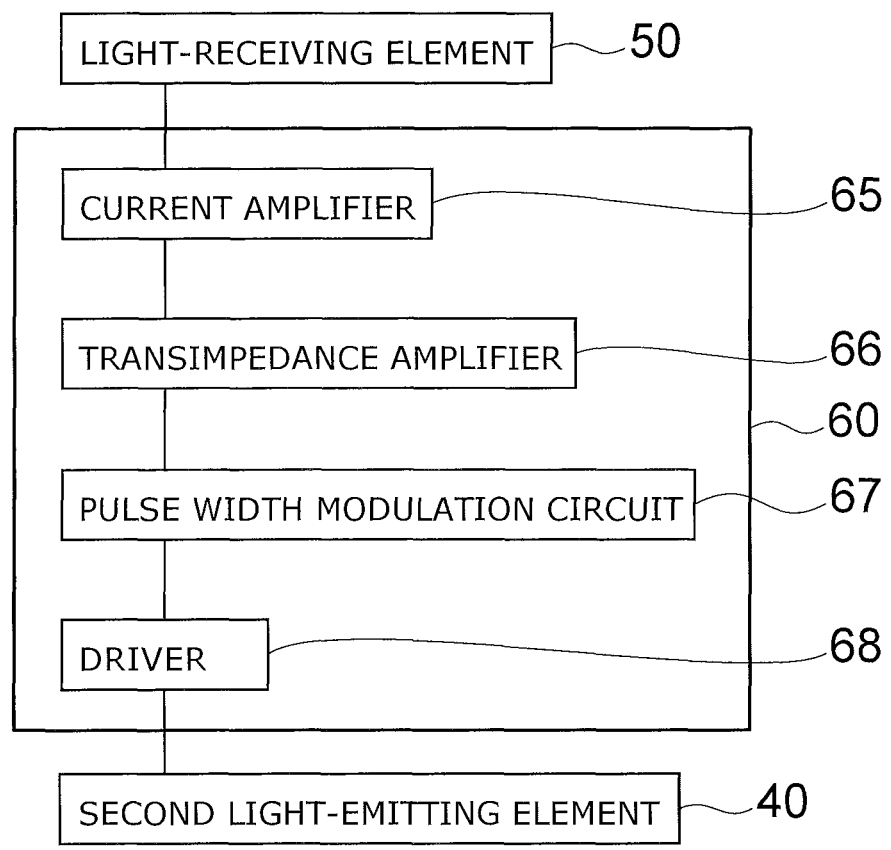
FIG. 10 is a block diagram showing a connectional relationship of the light-receiving element, a first drive element, and the second light-emitting element in the display device according to one embodiment.

FIG. 10 is a block diagram showing the connectional relationship of the light-receiving element 50, the first drive element 60, and the second light-emitting element 40 of each pixel part P.

The first drive element 60 includes a current amplifier 65, a transimpedance amplifier 66, a pulse width modulation circuit 67, and a driver 68.

The current amplifier 65 is electrically connected with the light-receiving element 50 via the first wiring layer 122 shown in FIG. 5 and amplifies the current output by the light-receiving element 50.

The transimpedance amplifier 66 is electrically connected with the current amplifier 65 and converts the current amplified by the current amplifier 65 into a voltage.

The pulse width modulation circuit 67 is electrically connected with the transimpedance amplifier 66 and generates a PWM (Pulse Width Modulation) signal that has a duty ratio determined based on the magnitude of the voltage output by the transimpedance amplifier 66.

The driver 68 is electrically connected with the pulse width modulation circuit 67 and generates a current to be supplied to the second light-emitting element 40 based on the PWM signal output by the pulse width modulation circuit 67.

The driver 68 is electrically connected with the two electrodes at the positive side and negative side of the second light-emitting element 40 via the first wiring layer 122, the first conductive member 61, and the bump 62 shown in FIG. 5, performs PWM control of the second light-emitting element 40, and causes the second light-emitting element 40 to emit light. The second light-emitting element 40 emits light having a brightness that corresponds to the intensity of the light received by the light-receiving element 50.

The control for the second light-emitting element 40 is not limited to PWM control, the brightness of the light emitted by the second light-emitting element 40 can be controlled by changing the current value supplied to the second light-emitting element 40 according to the intensity of the light received by the light-receiving element 50.

Figure 11:
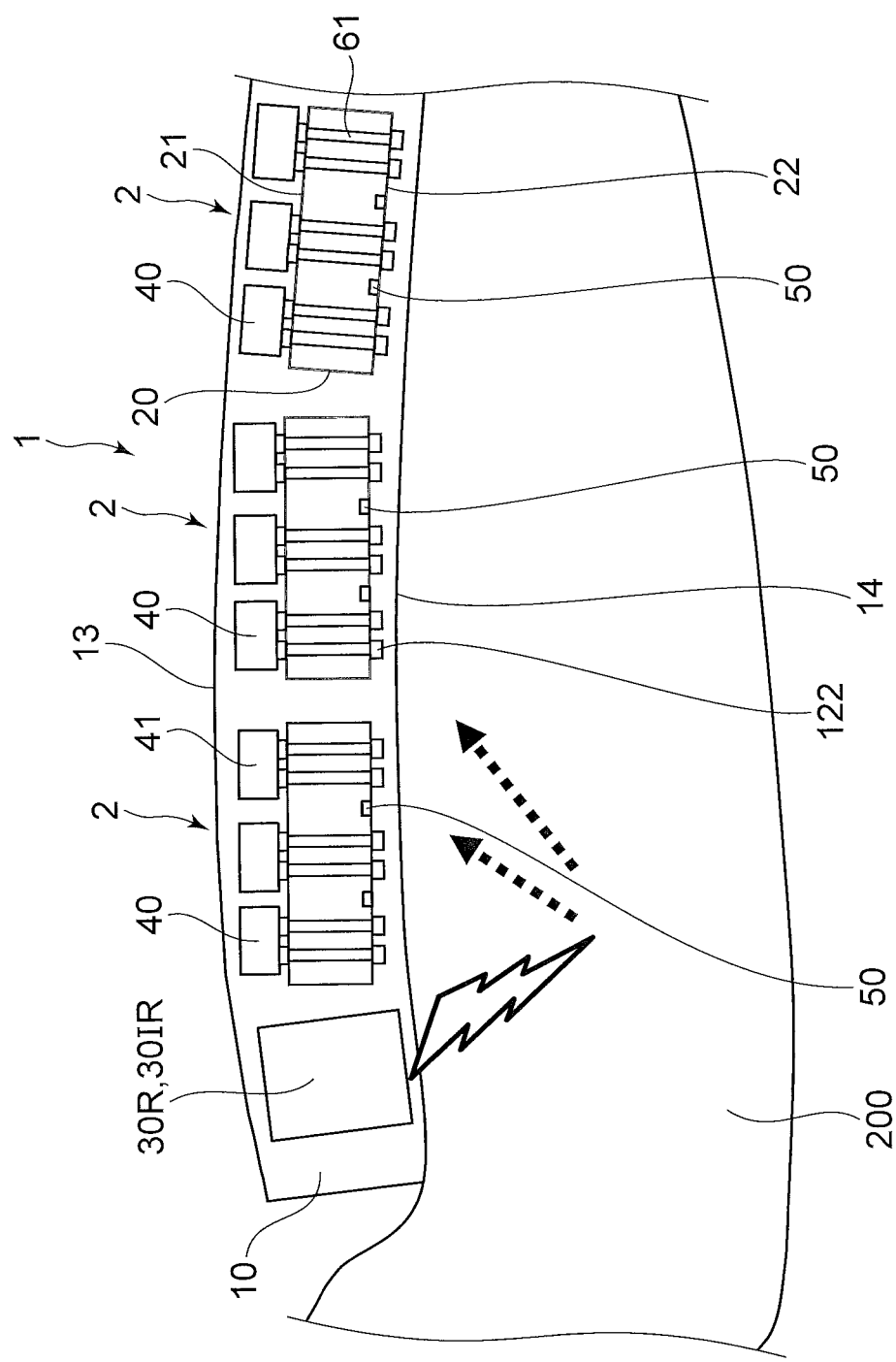
FIG. 11 is a schematic view showing a usage example of the display device according to one embodiment.

FIG. 11 is a schematic view showing a usage example of the display device 1 according to the embodiment.

The display device 1 according to the embodiment can be mounted to a human body, e.g., an arm 200 of a human. The fourth surface 14 of the holding member 10 is adhered to the surface of the skin of the arm 200. The first light-emitting elements 30R and 30IR are caused to emit light in this state. The reference light (e.g., only red light, only infrared light, or both red light and infrared light) that is emitted by the first light-emitting elements 30R and 30IR passes through the skin and is irradiated on the blood vessel.

For example, the light-receiving element 50 receives the reference light reflected by the blood vessel, and converts the received light into an electrical signal (a current). The first drive element 60 that is described above receives the electrical signal and causes the second light-emitting element 40 to emit light having a brightness corresponding to the intensity of the light received by the light-receiving element 50.

For example, the multiple second light-emitting elements 40 and the multiple light-receiving elements 50 corresponding to each other are arranged, positioned and electrically connected with a one-to-one relationship, and the image of the light received by the multiple light-receiving elements 50, that is, the image that shows the configuration of the blood vessel, is displayed on the third surface 13 side of the holding member 10 by the light emission of the multiple second light-emitting elements 40. In other words, the blood vessel that is under the skin and cannot be viewed with the naked eye can be visualized.

According to the embodiment, the first drive element 60 for driving the second light-emitting element 40 for the display, the second drive element 70 for driving the first light-emitting elements 30R and 30IR for the reference light, the light-receiving element 50, and the first conductive member 61 and the first wiring layer 122 for electrically connecting these components can be formed by wafer processes on a semiconductor wafer (e.g., a silicon wafer). A downsized and thinned display device 1 can be inexpensively obtained thereby, even while increasing the resolution by increasing the number of the light-receiving elements 50, the number of the second light-emitting elements 40, and the number of the first drive elements 60 connected to the light-receiving elements 50 and the second light-emitting elements 40.

As shown in FIGS. 1 and 2, the display device 1 can be bent because the multiple display parts 2 that are separated from each other are held by the flexible holding member 10, the display device 1 can be adhered to the surface of the skin, and a more accurate image of the blood vessel can be obtained. By providing the first light-emitting elements 30R and 30IR for each display part 2, the reference light can be irradiated on the blood vessel with low unevenness.

Figure 12:
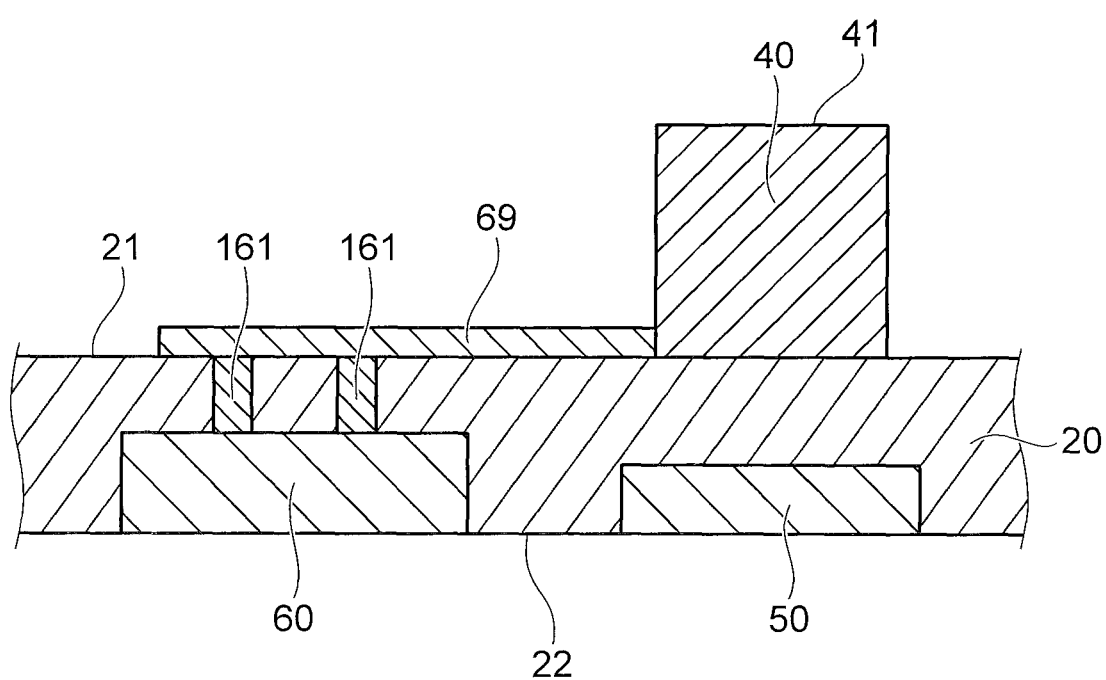
FIG. 12 is a schematic cross-sectional view showing another example of an arrangement of the light-receiving element, the first drive element, and the second light-emitting element in the display device according to one embodiment.

FIG. 12 is a schematic cross-sectional view showing another example of the arrangement of the light-receiving element 50, the first drive element 60, and the second light-emitting element 40.

In the example, the second light-emitting element 40 is located on the first surface 21 of the substrate 20 above the light-receiving element 50. This means that the light-receiving element 50 and at least a portion of the second light-emitting element 40 overlap when viewed in plan. It is preferable for the light-receiving element 50 and the entire second light-emitting element 40 to overlap when viewed in plan. Thereby, an image can be displayed that more accurately shows the position at which the light-receiving element 50 receives the light, i.e., the position of the visualization object below the light-receiving element 50. A wiring layer 69 that is connected with the second light-emitting element 40 is formed at the first surface 21 of the substrate 20, and the wiring layer 69 extends over the first drive element 60. A conductive member (a conductive via) 161 is formed in the substrate 20 between the wiring layer 69 and the first drive element 60. The conductive member 161 connects the wiring layer 69 and the first drive element 60. Accordingly, the second light-emitting element 40 is electrically connected with the first drive element 60 via the wiring layer 69 and the conductive member 161.

The first resin member 11 can include multiple layers having different refractive indexes. For example, by providing a layer at the fourth surface 14 side that has a relatively higher refractive index than the other layers of the first resin member 11, total internal reflections can be utilized to suppress the direct incidence on the light-receiving element 50 of the reference light from the first light-emitting elements 30R and 30IR.

The first light-emitting elements 30R and 30IR for the reference light can be one type, in other words, have the same light emission peak wavelength (light emission color). As in the embodiment, for example, an appropriate first light-emitting element can be selected according to the reflectance difference of the blood vessel and the transmittance difference of the skin due to the wavelength of the reference light by providing two types of first light-emitting elements 30R and 30IR having different light emission peak wavelengths. The visualization object is not limited to a blood vessel, and the visualization of biological information other than a blood vessel also is possible. Applications other than for a human body also are possible.

The oxygen saturation ($SpO_2$) also can be measured by irradiating red light and infrared light on the blood vessel as reference light and by using the ratio of the reflected light amount of the red light and the reflected light amount of the infrared light received by the light-receiving element 50. Also, the red region has a high absorption coefficient for deoxyhemoglobin, and the near-infrared region has a low absorption coefficient for deoxyhemoglobin. On the other hand, the red region has a low absorption coefficient for oxyhemoglobin, and the near-infrared region has a higher absorption coefficient for oxyhemoglobin than for deoxyhemoglobin. This relationship can be used to observe the oxidation state of the hemoglobin by comparing red light and near-infrared light. For example, when irradiating the light emitted by the first light-emitting elements 30R and 30IR on a blood vessel positioned several millimeters (mm) to ten and several mm from the skin surface, the absorptance of hemoglobin changes according to the oxygen saturation of the blood oxygen, therefore, it is necessary to select appropriate peak wavelengths according to the oxygen saturation of the irradiation object. For example, when a blood vessel is observed using the condition of an oxygen saturation of 83%, it is preferable for the first light-emitting element 30R to emit red light, and for the first light-emitting element 30IR to emit infrared light. Thereby, the light that is emitted by the first light-emitting elements 30R and 30IR is more easily reflected by the blood vessel to reach the light-receiving element 50.

The light-emitting surfaces 31 of the first light-emitting elements 30R and 30IR can be set to be in a direction parallel to the second direction B. Or, the light-emitting surface 41 of the second light-emitting element 40 can be set to be in a direction parallel to the first direction A. In such cases, the light emission directions of the first light-emitting elements 30R and 30IR and the second light-emitting element 40 can match each other. The light-receiving element 50 can receive the reflected light of the light emitted by the first light-emitting elements 30R and 30IR, and the second light-emitting element 40 can be caused to emit light based on the intensity of the reflected light and/or the information of the incident angle. For example, the first light-emitting elements 30R and 30IR can be used as a LiDAR light source, and a display can be performed by controlling the light distribution of the second light-emitting element 40 based on the information obtained by the light-receiving element 50.

The light emission color of the second light-emitting element 40 can be monochrome or multi-color. The second light-emitting element 40 can be integrated with the substrate 20. For example, the substrate 20 can be the growth substrate of the second light-emitting element 40. The light-receiving element 50 may not be integrated with the substrate 20.

Hereinabove, exemplary embodiments are described with reference to specific examples. However, the present disclosure is not limited to these specific examples. For example, as shown in FIGS. 1 and 2, the multiple display parts 2 can be utilized for objects having diverse configurations because the multiple display parts 2 are held by the holding member 10, and because the flexible holding member 10 is between the adjacent display parts 2. All modifications practicable by an appropriate design modification by one skilled in the art based on the embodiments of the invention described above also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

What is claimed is:

1. A display device, comprising:
a substrate including
a first surface, and
a second surface positioned at a side opposite to the first surface;
a first light-emitting element located at a lateral side of the substrate;
a plurality of light-receiving elements located at a second surface side of the substrate;
a plurality of second light-emitting elements located on the first surface of the substrate;
a first drive element controlling driving of the second light-emitting elements based on outputs of the light-receiving elements; and
at least one additional first drive element,
a light-emitting surface of the first light-emitting element being oriented in a first direction,
the first direction being parallel to a direction from the first surface toward the second surface,
light-emitting surfaces of the second light-emitting elements being oriented in a second direction,
the second direction being from the second surface toward the first surface,
one of the first drive element and the at least one additional first drive element is connected with one of the light-receiving elements that is most proximate to the one of the first drive element and the at least one additional first drive element, and
another of the first drive element and the at least one additional first drive element is connected with one of the second light-emitting elements that is most proximate to the another of the first drive element and the at least one additional first drive element.

2. The device according to claim 1, further comprising:
a first conductive member extending between the first surface and the second surface of the substrate, the first conductive member being electrically connected with the second light-emitting elements; and
a wiring layer located at the second surface side, the wiring layer being electrically connected with the first conductive member and the first drive element.

3. The device according to claim 1, wherein
a wavelength of light emitted by the first light-emitting element is a wavelength that can be received by the light-receiving elements.

4. The device according to claim 1, further comprising at least one additional first light-emitting element,
the first light-emitting element and the at least one additional first light-emitting element having light emission peak wavelengths different from each other.

5. The device according to claim 1, further comprising at least one additional first drive element,
one of the light-receiving elements is connected with at least one of the second light-emitting elements via one of the first drive element and the at least one additional first drive element.

6. The device according to claim 1, further comprising:
a holding member holding the substrate, the first light-emitting element, and the second light-emitting elements,
the holding member including
a third surface facing the first surface of the substrate, and
a fourth surface facing the second surface of the substrate.

7. The device according to claim 6, wherein
the light-emitting surface of the first light-emitting element does not protrude beyond the second surface of the substrate toward a fourth surface side of the holding member.

8. The device according to claim 6, further comprising:
a second drive element controlling driving of the first light-emitting element; and
a second conductive member located at the lateral side of the substrate,
the second conductive member being held by the holding member, and electrically connecting the first light-emitting element and the second drive element.

9. The device according to claim 6, further comprising:
a third light-shielding film located at the third surface of the holding member,
the light-emitting surfaces of the second light-emitting elements being exposed from the third light-shielding film.

10. The device according to claim 6, comprising:
a plurality of display parts,
at least one of the plurality of display parts including the substrate, the first light-emitting element, the light-receiving elements, the second light-emitting elements, and the first drive element, and
the display parts being held by the holding member.

11. The device according to claim 6, wherein
the holding member is a resin member.

12. A display device comprising:
a substrate including
a first surface, and
a second surface positioned at a side opposite to the first surface;
a first light-emitting element located at a lateral side of the substrate;
a plurality of light-receiving elements located at a second surface side of the substrate;
a plurality of second light-emitting elements located on the first surface of the substrate;
a first drive element controlling driving of the second light-emitting elements based on outputs of the light-receiving elements; and
a first light-shielding film located at a lateral surface of the substrate,
a light-emitting surface of the first light-emitting element being oriented in a first direction,
the first direction being parallel to a direction rom the first surface toward the second surface,
light-emitting surfaces of the second light-emitting elements being oriented in a second direction, and
the second direction being from the second surface toward the first surface.

13. A display device comprising:
a substrate including
a first surface, and
a second surface positioned at a side opposite to the first surface;

a first light-emitting element located at a lateral side of the substrate;
a plurality of light-receiving elements located at a second surface side of the substrate;
a plurality of second light-emitting elements located on the first surface of the substrate;
a first drive element controlling driving of the second light-emitting elements based on outputs of the light-receiving elements; and
a second light-shielding film located between the first light-emitting element and one of the light-receiving elements in a plan view,
a light-emitting surface of the first light-emitting element being oriented in a first direction,
the first direction being parallel to a direction from the first surface toward the second surface,
light-emitting surfaces of the second light-emitting elements being oriented in a second direction, and
the second direction being from the second surface toward the first surface.

* * * * *